United States Patent
Zhao

(10) Patent No.: US 11,529,802 B2
(45) Date of Patent: Dec. 20, 2022

(54) MANUFACTURING METHOD OF FLEXIBLE ELECTRONIC SUBSTRATE AND SUBSTRATE STRUCTURE

(71) Applicant: BOE TECHNOLOGY GROUP CO., LTD., Beijing (CN)

(72) Inventor: Ce Zhao, Beijing (CN)

(73) Assignee: Beijing BOE Technology Development Co., Ltd., Beijing (CN)

(*) Notice: Subject to any disclaimer, the term of this patent is extended or adjusted under 35 U.S.C. 154(b) by 285 days.

(21) Appl. No.: 16/765,056

(22) PCT Filed: May 21, 2019

(86) PCT No.: PCT/CN2019/087822
§ 371 (c)(1),
(2) Date: May 18, 2020

(87) PCT Pub. No.: WO2020/232634
PCT Pub. Date: Nov. 26, 2020

(65) Prior Publication Data
US 2021/0402753 A1    Dec. 30, 2021

(51) Int. Cl.
*H01L 51/00* (2006.01)
*B32B 43/00* (2006.01)
(Continued)

(52) U.S. Cl.
CPC ........ *B32B 43/006* (2013.01); *H01L 51/0097* (2013.01); *B32B 2457/206* (2013.01); *C22C 13/00* (2013.01); *H01L 27/3244* (2013.01)

(58) Field of Classification Search
CPC ............ B32B 43/006; B32B 2457/206; H01L 51/0097; H01L 27/3244; H01L 2227/326;
(Continued)

(56) References Cited

U.S. PATENT DOCUMENTS 9,847,500 B2    12/2017    Yu et al.
10,440,820 B2   10/2019    Jia et al.
(Continued)

FOREIGN PATENT DOCUMENTS

CN    105226186 A    1/2016
CN    105762280 A    7/2016
(Continued)

OTHER PUBLICATIONS

International Search Report in PCT/CN2019/087822 dated Feb. 27, 2020 in Chinese.

*Primary Examiner* — Donald L Raleigh
(74) *Attorney, Agent, or Firm* — Collard & Roe, P.C.

(57) ABSTRACT

A manufacturing method of a flexible electronic substrate and a substrate structure are disclosed. The manufacturing method includes: providing a first substrate comprising a first surface and a second surface which are opposite; forming a separation layer on the first surface of the first substrate, the separation layer being in a film form; providing a second substrate on the separation layer, the second substrate being configured as a flexible substrate; and processing the separation layer, such that at least a part of the separation layer is cracked from the film form, thereby separating the second substrate from the first substrate.

14 Claims, 7 Drawing Sheets

(51) Int. Cl.
  *C22C 13/00* (2006.01)
  *H01L 27/32* (2006.01)

(58) Field of Classification Search
  CPC .. H01L 27/1218; H01L 27/1266; C22C 13/00
  See application file for complete search history.

(56) References Cited

U.S. PATENT DOCUMENTS

| | | | |
|---|---|---|---|
| 2008/0075927 A1* | 3/2008 | Sakashita | H01L 21/76251 427/127 |
| 2009/0009063 A1* | 1/2009 | Botelho | H01L 51/5246 313/317 |
| 2014/0042399 A1 | 2/2014 | Park et al. | |
| 2016/0347047 A1* | 12/2016 | Eguchi | B32B 43/006 |
| 2018/0166583 A1* | 6/2018 | Cho | H01L 21/02288 |
| 2018/0184519 A1* | 6/2018 | Jia | H01L 51/0097 |

FOREIGN PATENT DOCUMENTS

| | | | | |
|---|---|---|---|---|
| CN | 106784353 A | * | 5/2017 | H01L 51/003 |
| CN | 106784353 A | | 5/2017 | |
| CN | 107123371 A | | 9/2017 | |
| TW | 201113843 A | | 4/2011 | |
| WO | WO-2009131114 A1 | * | 10/2009 | B23K 35/262 |

* cited by examiner

MANUFACTURING METHOD OF FLEXIBLE ELECTRONIC SUBSTRATE AND SUBSTRATE STRUCTURE

CROSS REFERENCE TO RELATED APPLICATIONS

This application is the National Stage of PCT/CN2019/087822 filed on May 21, 2019, the disclosure of which is incorporated by reference.

TECHNICAL FIELD

Embodiments of the present disclosure relate to a manufacturing method of a flexible electronic substrate and a substrate structure.

BACKGROUND

With the development of flexible electronic technologies, a flexible electronic device with foldability is preferred gradually. For example, in order to implement narrow bezel or even bezel-free display of a display device, a non-display area of the display device may be bent; or for portability, the electronic device may also be curved. The performance of the flexible electronic device is closely related to a manufacturing process, and how to improve the flexible electronic technologies is a concern in the field.

SUMMARY

At least some embodiments of the present disclosure provide a manufacturing method of a flexible electronic substrate, comprising: providing a first substrate comprising a first surface and a second surface which are opposite; forming a separation layer on the first surface of the first substrate, wherein the separation layer is in a film form; providing a second substrate on the separation layer, wherein the second substrate is configured as a flexible substrate; and processing the separation layer, such that at least a part of the separation layer is cracked from the film form, thereby separating the second substrate from the first substrate.

In some examples, the processing action is physical processing.

In some examples, cracking of at least a part of the separation layer from the film form comprises: changing at least a part of the separation layer from the film form into a powder form.

In some examples, the processing action comprises a cooling processing action.

In some examples, the separation layer comprises one or more selected from the group consisting of tin and a tin alloy.

In some examples, in a case where the processing action comprises the cooling processing action, the cooling processing action comprises cooling the separation layer below 13.2 degrees Celsius.

In some examples, the processing action comprises making a nucleating agent come into contact with the separation layer to crack the separation layer.

In some examples, the nucleating agent comprises one or more selected from the group consisting of gray tin, cadmium telluride and indium antimonide.

In some examples, an alloying element in the tin alloy comprises, in addition to tin, one or more selected from the group consisting of aluminum, copper, magnesium, manganese, zinc, bismuth, lead, antimony, silver, gold and germanium.

In some examples, the tin element in the separation layer has a mass percentage of at least 30%.

In some examples, cracking of the separation layer from the film form comprises: transforming the tin from white tin to gray tin.

In some examples, the separation layer comprises a groove structure or a hollow structure.

In some examples, the groove structure or the hollow structure has an area percentage of 10% to 50%.

In some examples, a planar structure of the groove structure or the hollow structure has a shape of circle, rhombus, rectangle, triangle or irregular polygon.

In some examples, the second substrate comprises a third surface and a fourth surface which are opposite, the third surface is closer to the first substrate, and the manufacturing method further comprises: manufacturing a first operation circuit on the fourth surface of the second substrate before processing the separation layer.

In some examples, the manufacturing method further comprises: manufacturing a second operation circuit on the second surface of the first substrate before processing the separation layer.

At least some embodiments of the present disclosure provide a substrate structure, comprising a first substrate, a second substrate and a separation layer, the second substrate is configured as a flexible substrate, and the separation layer is located between the first substrate and the second substrate which are connected by the separation layer, and at least a part of the separation layer is configured to be cracked from a film form to separate the first substrate from the second substrate.

In some examples, the separation layer comprises one or more selected from the group consisting of tin and a tin alloy.

In some examples, an alloying element in the tin alloy comprises, in addition to tin, one or more selected from the group consisting of aluminum, copper, magnesium, manganese, zinc, bismuth, lead, antimony, silver, gold and germanium.

In some examples, the separation layer comprises a groove structure or a hollow structure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
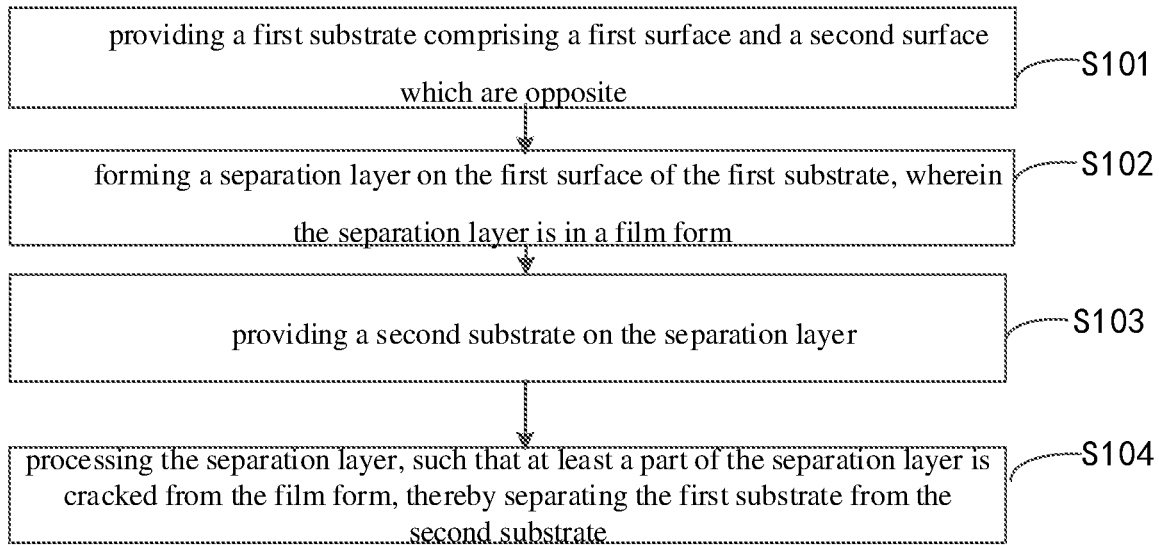
FIG. 1 is a flow chart of a manufacturing method of a flexible electronic substrate according to some embodiments of the present disclosure.

In the following, technical solutions of the embodiments of the present disclosure will be clearly and completely described with reference to non-limitative exemplary embodiments shown in the drawings and detailed in the following description, the exemplary embodiments of the present disclosure and their various features and advantageous details will be described more fully. It should be noted that the features shown in the figures are not necessarily drawn to scale. Descriptions of known materials, components, and process technologies are omitted from this disclosure so as not to obscure exemplary embodiments of this disclosure. The examples given are only intended to facilitate understanding of the implementation of the exemplary embodiments of the present disclosure and to further enable those skilled in the art to implement the exemplary embodiments. Therefore, these examples should not be construed as limiting the scope of the embodiments of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Furthermore, in various embodiments of the present disclosure, the same or similar reference numerals refer to the same or similar components.

In the process of manufacturing a flexible electronic device such as a flexible display, a flexible base substrate may be first manufactured at or adhered to a surface of a rigid bearing substrate (for example, a glass substrate), and then a display device is manufactured on the flexible base substrate. After the display device is manufactured, the flexible base substrate is separated from the bearing substrate.

In a separation method, adhesion between the flexible base substrate and the bearing substrate is reduced by use of laser irradiation, thereby separating the flexible base substrate from the bearing substrate. However, high-energy laser is required for scanning in the laser irradiation separation method, which results in a low production efficiency, and a laser apparatus also has a high cost. Meanwhile, the device already manufactured on the flexible substrate may be damaged by the scanning action of the high-energy laser, which in turn affects the performance of the flexible electronic device.

In another separation method, a chemical solution (reaction solution) is adopted to react at the contact surfaces of the flexible base substrate and the bearing substrate, thereby separating the flexible base substrate from the bearing substrate. However, the chemical solution tends to corrode the flexible base substrate and the device formed thereon, and also affects the performance of the flexible electronic device.

At least one embodiment of the present disclosure provides a manufacturing method of a flexible electronic substrate, in which a film-form separation layer between a first substrate and a second substrate which are bonded by the separation layer is processed to render the separation layer from the film form to crack, thereby separating the second substrate from the first substrate. With the manufacturing method, damages to the first substrate and the second substrate as well as damages to the operation circuits formed thereon can be reduced.

Figure 2:
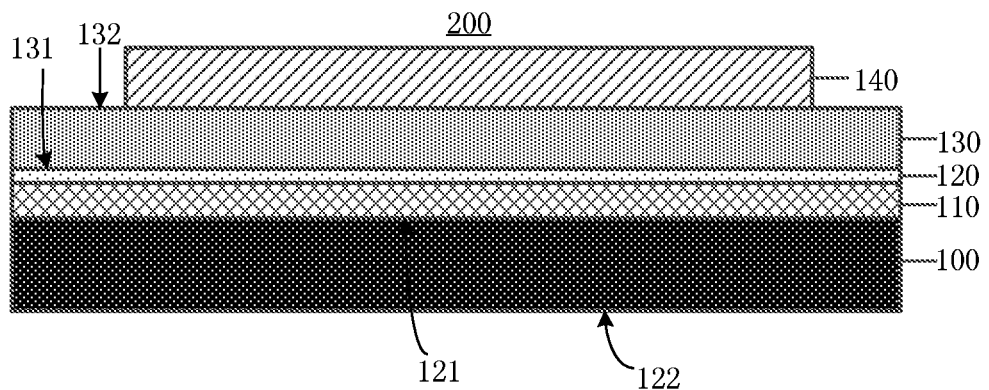
FIG. 2 is a schematic diagram of a substrate structure according to some embodiments of the present disclosure.

FIG. 1 shows a flow chart of a manufacturing method of a flexible electronic substrate according to some embodiments of the present disclosure, and FIG. 2 shows a schematic diagram of a substrate structure according to some embodiments of the present disclosure.

A manufacturing method of a flexible electronic substrate according to embodiments of the present disclosure is exemplified below with reference to FIGS. 1 and 2. As shown in FIG. 1, the manufacturing method at least includes steps S101-S104.

Step S101: providing a first substrate 100.

The first substrate 100 includes a first surface 121 and a second surface 122 which are opposite to each other.

For example, the first substrate 100 may be configured as a rigid substrate, such as a glass substrate, a plastic substrate, a stainless steel substrate, or the like. For example, the first substrate 100 can provide stable support for a subsequent fabrication of an operation circuit on a second substrate.

Step S102: forming a separation layer 110 on the first surface 121 of the first substrate 100, wherein the separation layer 110 is in the film form.

For example, the separation layer 110 uniformly covers the first surface 121 of the first substrate 100 in a continuous film form.

For example, the separation layer 110 has a thickness ranging from 10 nm to 10 μm, such as from 50 nm to 500 nm, for example, 150 nm.

For example, the separation layer 110 may be formed on the first surface 121 of the first substrate 100 with a physical vapor deposition (PVD) process or a chemical vapor deposition (CVD) process.

In some examples, the separation layer 110 includes tin or a tin alloy. For example, alloying elements in the tin alloy include, in addition to tin, one or more selected from the group consisting of aluminum, copper, magnesium, manganese, zinc, bismuth, lead, antimony, silver, gold and germanium. For example, the tin element in the separation layer 110 has a mass percentage of at least 30%, for example, 50% to 100%.

Step S103: providing a second substrate 130 on the separation layer 110.

The second substrate 130 is configured as a flexible substrate and includes a third surface 131 and a fourth surface 132 which are opposite to each other, and the third surface 131 is closer to the first substrate 100.

For example, the second substrate 130 is made of polyimide (PI), polyethylene terephthalate (PET), polyethylene naphthalate (PEN), polyether sulfone (PES), polycarbonate (PC), polyimide (PI), a derivative thereof, or the like, may have suitable flexibility according to applications, and thus may be bent or folded as required.

For example, in the substrate structure 200 as shown in FIG. 2, the second substrate 130 may be adhered to the surface of the separation layer 110 by an adhesive layer 120, and thus bonded to the first substrate 100 to be supported by the first substrate 100. For example, the adhesive layer 120 is made of an acrylic resin or epoxy.

In some other examples, the second substrate 130 may be formed on the separation layer 110 directly, for example, with a spin coating process, a curing process, or the like, and thus bonded to the first substrate 100 to be supported by the first substrate 100. The way in which the second substrate 130 is provided on the separation layer 110 is not limited in the embodiments of the present disclosure.

Step S104: processing the separation layer 110, such that at least a part of the separation layer 110 is cracked from the film form to separate the second substrate 130 from the first substrate 100.

For example, the processing action is a physical processing. That is, the separation layer 110 is cracked from the film form physically, which prevents the second substrate 130 and a device (for example, a first operation circuit 140 in the following) that is on the second substrate from being damaged by a stimulus caused by a chemical reaction used in a chemical treatment, compared with a conventional peeling way in which a peelable layer is burnt by a high-energy laser to be decomposed into a gas or reacts with a chemical reaction solution to be decomposed.

For example, the physical processing action is a cooling processing action, a heating processing action, a light irradiation processing action, or the like.

Figure 3A:
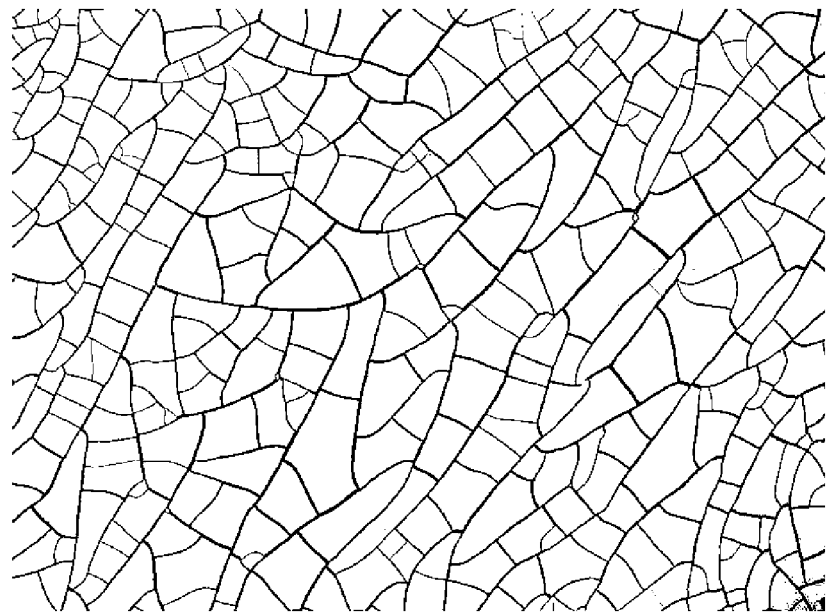
FIG. 3A is a schematic diagram in which a separation layer is cracked into fragments according to some embodiments of the present disclosure.

FIG. 3A shows a schematic diagram in which the separation layer 110 is cracked. As shown in FIG. 3A, the film-form separation layer 110 is cracked into a plurality of bulk fragments having, for example, an average size (average side length) of hundreds of nanometers to several micrometers, for example, 500 nm to 5 μm.

Figure 3B:
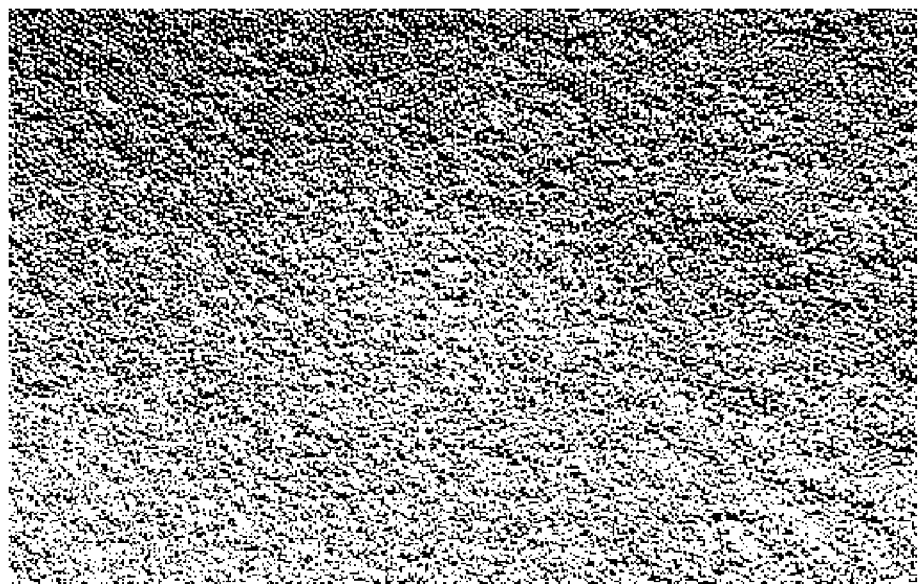
FIG. 3B is a schematic diagram in which the separation layer is cracked into powders according to some embodiments of the present disclosure.

In some other examples, as shown in FIG. 3B, the separation layer 110 is cracked from the film form into a powder form, and for example, the powders have an average particle size ranging from 10 nm to 500 nm.

In some examples, the separation layer 110 includes one or more selected from the group consisting of tin and tin alloys, and may be cooled to be cracked. Tin is a metal with allotropes. At 13.2-161 degrees Celsius, tin has a stable body-centered tetragonal crystal structure, in white, has a density of 7.28 g/cm3, and is called white tin (also called β-Sn); when the temperature drops below 13.2 degrees Celsius, tin may have a diamond cubic structure transformed from the body-centered tetragonal crystal structure, has a density of 5.75 g/cm3, and is known as gray tin (also known as α-Sn). Gray tin has a lattice structure similar to silicon, and thus has semiconductor properties and intrinsic brittleness. Because the transformation from white tin to gray tin is accompanied by a volume expansion of 26%-27%, the thin film of tin is cracked after the transformation and can be smashed completely (as shown in FIG. 3B).

For example, the separation layer 110 includes the thin film of tin. For example, after the device (for example, the first operation circuit 140 in the following) is manufactured on the second substrate 130, the first substrate 100 bearing the second substrate 130 is placed in an environment below 13.2 degrees Celsius (for example, a cabinet with a refrigeration function). That is, the separation layer 110 is cooled below 13.2 degrees Celsius, the thin film of tin is cracked and changed into the powder form due to the allotropic transformation from white tin to gray tin, thereby separating the second substrate 130 from the first substrate 100.

The method has a simple operation and is at a low cost, and does not damage the second substrate 130 and the device thereon.

For example, the difference in Gibbs free energy between a β phase (corresponding to white tin) and an α phase (corresponding to gray tin) of tin increases with the decrease of the temperature, which increases the driving force of the transformation from the 13 phase to the a phase; however, a lower temperature also lowers thermal energy of atoms in a lattice, which reduces power, such that the required atoms are less likely to pass through adjacent interfaces.

Figure 3C:
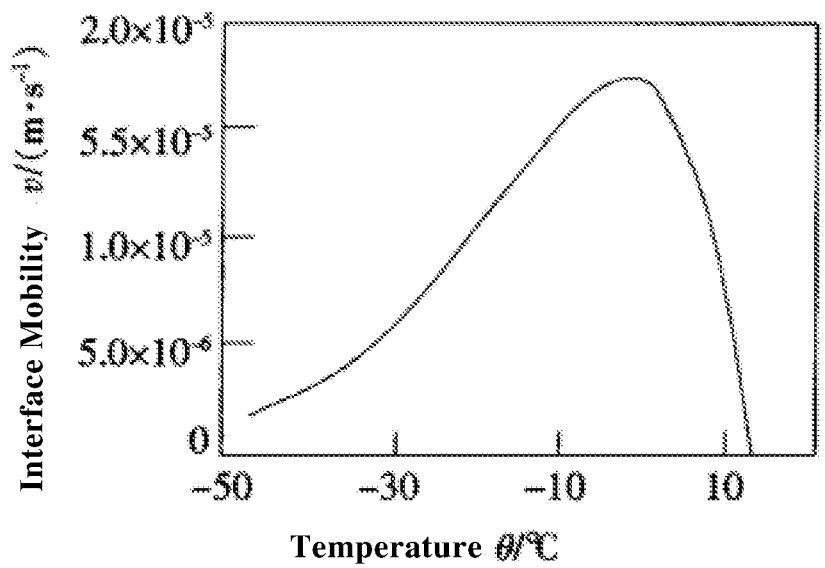
FIG. 3C shows a variation curve of interface mobility versus temperature during the transformation of white tin into gray tin.

FIG. 3C shows a variation curve of interface mobility versus temperature during the transformation of white tin into gray tin. As shown in FIG. 3C, a peak rate is approximately at −2.5 degrees Celsius, and then the interface mobility decreases rapidly with the decrease of temperature. For example, in practice, the first substrate 100 bearing the flexible electronic device may be placed at a low temperature (for example, −40 degrees Celsius) to form α-Sn phase nuclei in the separation layer 110, and then placed at a suitable temperature (for example, −2.5 degrees Celsius) to allow α-Sn phase crystal grains to grow rapidly, thereby cracking the separation layer 110 from the film form into the powder form more rapidly.

For example, the transformation to gray tin has a creeping property, which accelerates the transformation from white tin to gray tin when white tin comes into contact with a nucleating agent, such as gray tin. For example, the above-mentioned separation layer 110 containing tin may be cooled while coming into contact with the nucleating agent, so as to accelerate the transformation from white tin into gray tin. For example, the nucleating agent includes one or more selected from the group consisting of gray tin, cadmium telluride (CdTe) and indium antimonide (InSb).

Figure 3D:
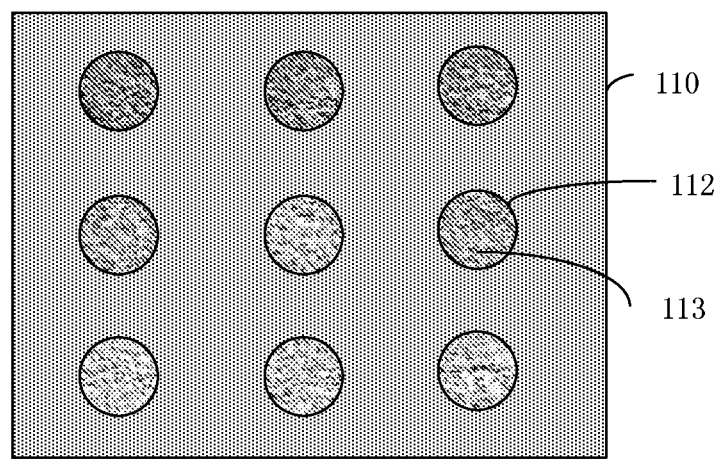
FIG. 3D is a schematic diagram in which the separation layer comes into contact with a nucleating agent according to an embodiment of the present disclosure.

For example, as shown in FIG. 3D, after the separation layer 110 is formed, a groove structure or a hollow structure 112 is formed on the separation layer 110 and then is filled with the nucleating agent 113, such that the nucleating agent comes into contact with tin in the separation layer 110. For example, the groove structure or the hollow structure 112 is formed by performing a patterning process (e.g., photolithography) on the separation layer 110. For example, the groove structure or the hollow structure 112 accounts for 10% to 50% of an area of the separation layer. If the percentage is too large, the percentage may affect an adhesion stability of the second substrate 130, and is unable to allow a sufficient contact area to be formed between the nucleating agent 113 and the separation layer 110 when too small.

For example, the nucleating agent 113 is one or more selected from the group consisting of gray tin powder, cadmium telluride powder and indium antimonide powder. For example, the surface of the nucleating agent 113 is substantially flush with or lower than the surface of the separation layer 110. Then, the second substrate 130 is provided on the separation layer 110 and a subsequent process is performed. In the subsequent cooling processing action, the allotropic transformation of tin can be accelerated by the arrangement. Because the ambient temperature does not reach the transformation temperature of white tin in the subsequent process, the provision of the nucleating agent 113 does not affect the stability of the separation layer 110, and does not affect the subsequent process adversely.

In some other examples, after the flexible electronic substrate is manufactured, a hole may be punched in a region (for example, a peripheral region) of the second substrate 130 where no device is formed, so as to expose at least a part of the separation layer 110, and then the nucleating agent may be provided in the hole to come into contact with tin in the separation layer 110, thereby accelerating the transformation from white tin into gray tin. For example, the hole may be punched in the second substrate 130 by laser. Because the region where no device is formed may be selected as the punched region, the performance of the device on the second substrate 130 may not be affected.

For example, the separation layer 110 may also include a tin alloy. For example, alloying elements in the tin alloy include, in addition to tin, one or more selected from the group consisting of aluminum, copper, magnesium, manganese, zinc, bismuth, lead, antimony, silver, gold and germanium.

Researches show that the introduction of a small quantity of other metal element(s) into tin may promote or inhibit the allotropic transformation of tin and also influence the transformation temperature. For example, the introduction of an element, such as aluminum, copper, magnesium, manganese, zinc, or the like, can accelerate this transformation; the introduction of an element, such as bismuth, lead, antimony, silver, gold, or the like, can slow down the transformation.

For example, the alloying elements in the separation layer 110 include, in addition to tin, one or more selected from the group consisting of aluminum, copper, magnesium, manganese and zinc to accelerate the transformation from white tin into gray tin. For example, the separation layer 110 includes one or more selected from the group consisting of a tin-aluminum alloy, a tin-copper alloy, a tin-magnesium alloy, a tin-manganese alloy, and a tin-zinc alloy.

For example, in order to guarantee smooth progress of the allotropic transformation, the tin element in the separation layer 110 has a mass percentage of at least 30%, for example, 50% to 100%.

On the basis of the above-mentioned embodiments, for example, in some examples, the separation layer 110 includes a plurality of grooves or hollow structures. The groove structure or the hollow structure may create a space for deformation (expansion) of tin in a direction parallel to the surface of the first substrate 100, and reduces the deformation amount in the direction perpendicular to the first substrate 100, thereby reducing the influence of the deformation on the subsequent provision of the second substrate 130.

For example, a maximum depth (in the direction perpendicular to the first substrate 100) of the groove structure or the hollow structure may be selected according to the thickness of the separation layer, and for example, may be 50% to 100% of the thickness of the separation layer. That is, in the case where the separation layer is thin, the groove has a hollow structure; for example, the groove structure or the hollow structure has the maximum depth less than 1 micrometer. The arrangement avoids an adverse effect of unevenness of the contact interfaces of the second substrate 130 and the separation layer 110 due to the arrangement of the groove structure or the hollow structure on the subsequent fabrication of the device.

Figure 4A:
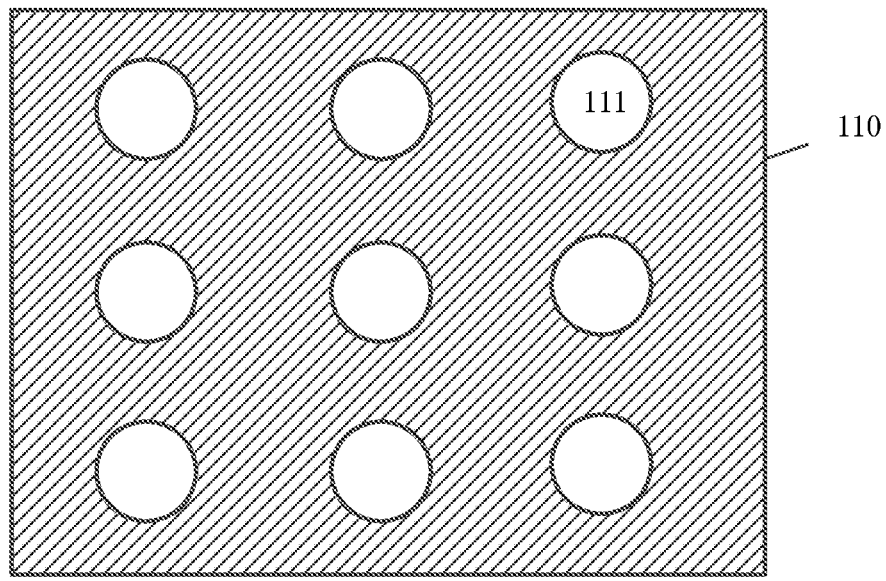
FIGS. 4A-4B are schematic diagrams of a planar structure of the separation layer according to some embodiments of the present disclosure.
Figure 4B:
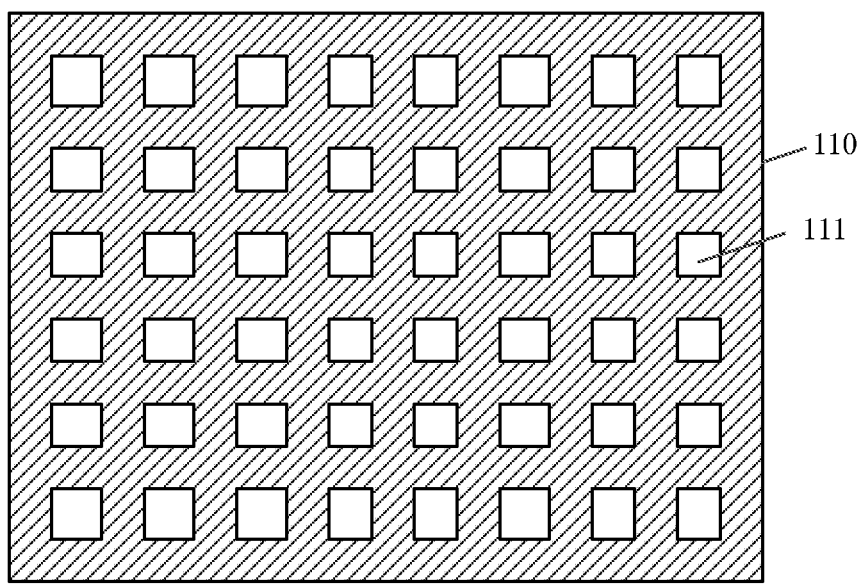

FIGS. 4A and 4B show several exemplary planar structures of the separation layer 110. For example, the planar structure of the groove structure or the hollow structure 111 has a shape of circle, rhombus, rectangle, triangle or irregular polygon. For example, the plurality of grooves or hollow structures 111 are distributed in the separation layer 110 uniformly. For example, the separation layer 110 is in a mesh shape; that is, the separation layer 110 includes a plurality of hollow structures 111 distributed in an array.

For example, the groove structure or the hollow structure accounts for 10% to 50% of the area of the separation layer. If the percentage is too large, the percentage may affect the adhesion stability of the second substrate 130, and is unable to create a sufficient deformation space when too small.

For example, the groove structure or the hollow structure may be formed by performing a patterning process, for example, the conventional photolithography process, on the separation layer 110.

In some other examples, the manufacturing method of the flexible electronic substrate may further include: manufacturing the first operation circuit 140 on the fourth surface 132 of the second substrate 130 before the separation layer 110 is processed (step S104).

After bonded to the first substrate 100, the second substrate 130 is supported by the first substrate 100, and thus, a circuit forming process, for example, a semiconductor process, a printed circuit process, or the like, may be performed on the second substrate 130 more accurately. For example, the first operation circuit 140 may include a display circuit or a touch circuit, thereby forming a flexible electronic substrate having a display function or a touch function. As another example, the first operation circuit 140 may include both the display circuit and the touch circuit which are located at different layers relative to the second substrate 130, and for example, may be overlapped at least partially. For example, the touch circuit may be of various types, such as a resistive touch circuit or a capacitive touch circuit, and the capacitive touch circuit may be configured as a self-capacitance touch circuit or a mutual-capacitance touch circuit.

For example, in the case of including a display circuit, the first operation circuit 140 may include a thin film transistor array, a gate drive circuit, a data drive circuit, or the like; for example, in the case of including a touch circuit, the first operation circuit 140 may include a scan drive circuit, a sensing circuit, a touch electrode, or the like.

Figure 5A:
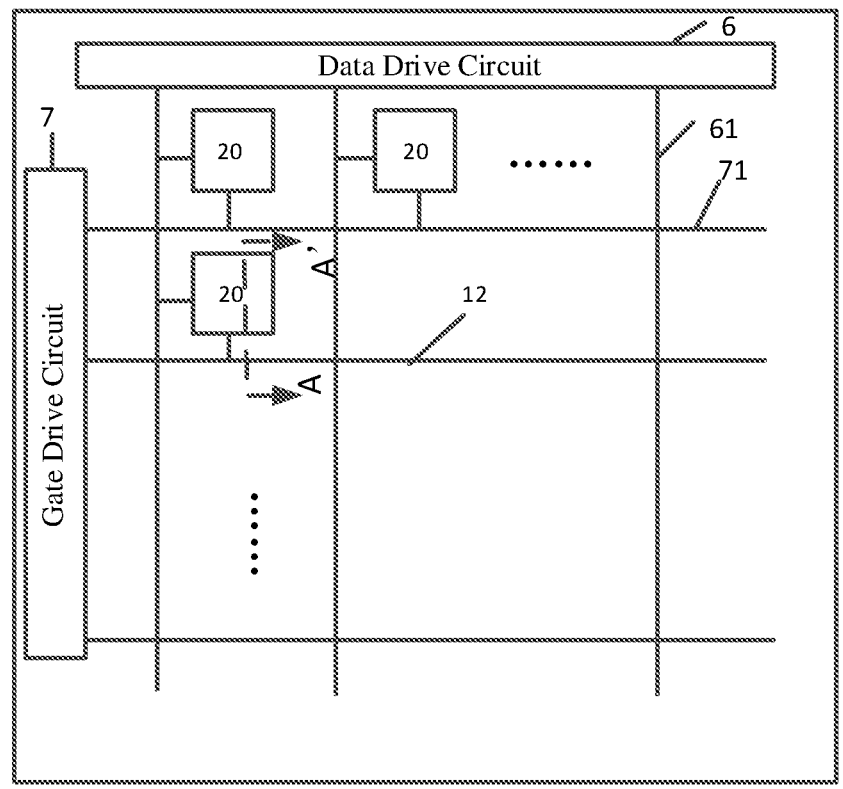
FIG. 5A is a schematic planar diagram of a flexible electronic substrate according to some embodiments of the present disclosure.
Figure 5B:
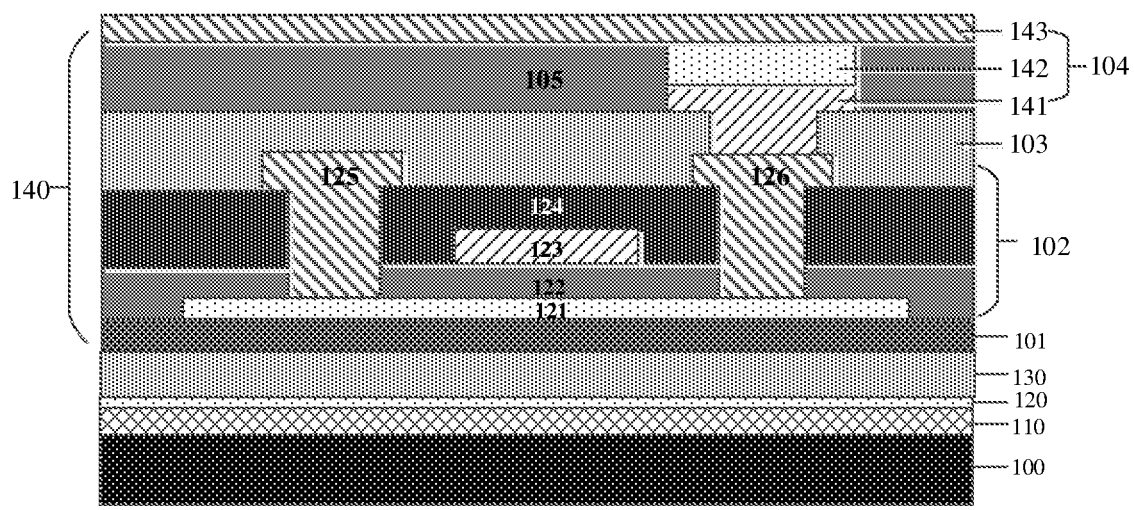
FIG. 5B is a schematic sectional diagram along sectional line A-A' in FIG. 5A.

A method of manufacturing the first operation circuit 140 according to the embodiment of the present disclosure is exemplified below with reference to FIGS. 5A to 5B with formation of a first operation circuit applied to an organic-light-emitting-diode display device as an example. FIG. 5A is a schematic planar diagram of the flexible electronic device according to some embodiments of the present disclosure, and FIG. 5B is a sectional view along sectional line A-A' in FIG. 5A.

As shown in FIG. 5A, the first operation circuit 140 includes a plurality of pixel units 20 arranged on the second substrate 130 in an array, a plurality of gate lines 71 and a plurality of data lines 61; the plurality of gate lines 71 and the plurality of data lines 61 intersect with each other to define a plurality of pixel regions, the plurality of pixel units 20 are distributed in the plurality of pixel regions in one-to-one correspondence, each pixel unit 20 includes an organic light-emitting diode and a pixel circuit for driving the organic light-emitting diode to emit light, and for example, the pixel circuit may include a plurality of thin film transistors, such as a drive transistor, a switching transistor, or the like.

For example, the first operation circuit 140 may further include a data drive circuit 6 for providing a data signal for the pixel unit 20 and a gate drive circuit 7 for providing a scanning signal for the pixel unit 20; in addition, the flexible substrate may further include other circuits or devices for further providing other various control signals. The data drive circuit and the gate drive circuit are connected with the pixel unit 20 by the data line 61 and the gate line 71 respectively, and each pixel unit 20 is connected with the gate line 71 and the data line 61, or the like, to receive corresponding electrical signals to emit light, so as to implement a display operation.

The manufacturing method of the first operation circuit 140 is exemplified below with reference to FIG. 5B. For clarity, only the organic light-emitting diode 104 and the thin film transistor 102 connected directly with the organic light-emitting diode 104 in the pixel unit 20 are shown in FIG. 5B.

For example, the thin film transistor 102 may be as a drive transistor and may be configured to operate in a saturation state and control the current for driving the organic light-emitting diode 104 to emit light; for example, the thin film transistor 102 may also be as a light emission control transistor and may be configured to control the flow of the current for driving the organic light-emitting diode 104 to emit light, which is not limited in the embodiments of the present disclosure.

As shown in FIG. 5B, a buffer layer 101 may be formed on the second substrate 130 first, is configured to improve the surface flatness of the second substrate, may also prevent the influence on the performance of the device due to diffusion of impurities (such as metal ions) in the second substrate 130 into the first operation circuit, and for example, may also prevent the corrosion caused when moisture enters the first operation circuit 140 through the second substrate 130.

For example, the buffer layer 101 may include a single layer of insulating material or a plurality of layers of insulating materials, such as silicon nitride, silicon oxide, silicon oxynitride, aluminum oxide, or the like.

For example, the buffer layer 101 may be formed on the second substrate 130 with chemical vapor deposition (CVD). For example, the buffer layer has a thickness of 200 nm to 400 nm, for example, 250 nm to 300 nm.

Next, the pixel array including the plurality of thin film transistors is formed on the buffer layer 101; as shown in FIG. 5B, taking formation of the thin film transistor 102 as an example, a manufacturing process includes: for example, forming an active layer 121, a gate insulation layer 122, a gate 123, an interlayer insulation layer 124, and a source-drain layer (including a source 125 and a drain 126) of the thin film transistor 102.

For example, the active layer 121 may be made of amorphous silicon, polycrystalline silicon, a metal oxide semiconductor material, or the like, and for example, the metal oxide semiconductor material may be indium gallium zinc oxide (IGZO), indium zinc oxide (IZO), aluminum zinc oxide (AZO), indium tin zinc oxide (ITZO), indium zinc hydride oxide (HIZO), aluminum-doped tin zinc indium oxide (ATZIO), aluminum-doped tin zinc oxide (ATZO), zinc tin oxide (ZTO), cadmium-doped tin oxide (GTO), indium cadmium tin oxide (IGTO), or the like. For example, the active layer 121 may have a single-layer structure or a multi-layer structure.

For example, the gate insulation layer 122 and the interlayer insulation layer 124 may be made of an inorganic insulation material, such as silicon nitride, silicon oxynitride, aluminum oxide, or the like, or an organic insulation material, such as acrylic acid, polymethyl methacrylate (PMMA), or the like. For example, the gate insulation layer may have a single-layer structure or a multi-layer structure.

For example, the gate 123 and the source-drain layer may be made of gold (Au), silver (Ag), copper (Cu), aluminum (Al), molybdenum (Mo), magnesium (Mg), titanium (Ti), hafnium (Hf), thallium (Ta), chromium (Cr), or alloy materials thereof.

For example, an insulation layer may be formed with a chemical vapor deposition process, an organic insulation layer may be formed with a spin coating or ink-jet printing process, a conductive layer and a semiconductor layer may be formed with a sputtering process, and a patterning process of a material layer may be implemented with a photolithography process. These methods are not repeated herein.

Then, a planarization layer 103 and a first electrode 141 are formed on the source-drain layer. The first electrode 141 is connected with the drain 126 of the thin film transistor through a via hole penetrating through the planarization layer 103.

For example, the planarization layer may be made of an organic insulation material (for example, an acryl material) or an inorganic insulation material (for example, an oxide of silicon or a nitride of silicon) or have a laminated structure of an organic insulation material and an inorganic insulation material. For example, the planarization layer may have a single-layer material structure or a multi-layer material structure.

For example, the first electrode 141 serves as an anode of the organic light-emitting diode 104, and for example, may be made of a metal or a conductive metal oxide (for example, ITO, AZO), or have a laminated structure of a metal and a conductive metal oxide.

It is to be noted that due to symmetry of physical structures, the source and the drain of the thin film transistor may be interchanged as required during electrical connection.

Next, a pixel defining layer 105 is formed on the first electrode 141, and an opening exposing at least a part of the first electrode 141 is formed on the pixel defining layer 105 with a patterning process to define a light-emitting region.

For example, the pixel defining layer is made of an organic material, such as polyimide (PI), other organic resins, or the like. The process of forming the pixel defining layer includes: for example, coating a PI solution; curing the PI solution to form a PI layer; and then performing a patterning process on the PI layer to form the pixel defining layer.

Then, an organic light-emitting layer 142 and a second electrode 143 are sequentially formed corresponding to the opening in the pixel defining layer 105, thereby forming the organic light-emitting diode 104.

For example, the organic light-emitting layer and the second electrode are formed with an evaporation process.

For example, the organic light-emitting layer 142 may be made of a macromolecular light-emitting material, a micromolecular light-emitting material, or the like. For example, the light-emitting element 104 has a top emission structure, the first electrode 141 has reflectivity, and the second electrode 143 has transmissivity or semi-transmissivity. For example, the first electrode 141 is made of a material with a high work function to serve as the anode, and for example, has an ITO/Ag/ITO laminated structure; the second electrode 143 is made of a material with a low work function to serve as a cathode, for example, a semi-transmissive metal or metal alloy material, such as an Ag/Mg alloy material.

For example, a thin-film encapsulation layer may be further formed on the second electrode 143 to encapsulate the organic light-emitting diode, thereby preventing the device from being damaged by permeation of external moisture and oxygen. For example, the thin-film encapsulation layer includes an organic thin film or a structure in which an organic thin film and an inorganic thin film are stacked alternately. For example, a water absorption layer (not shown) may be further formed between the thin-film encapsulation layer and the organic light-emitting diode, and configured to absorb moisture or sol remaining in the organic light-emitting diode during the previous manufacturing process.

Figure 6A:
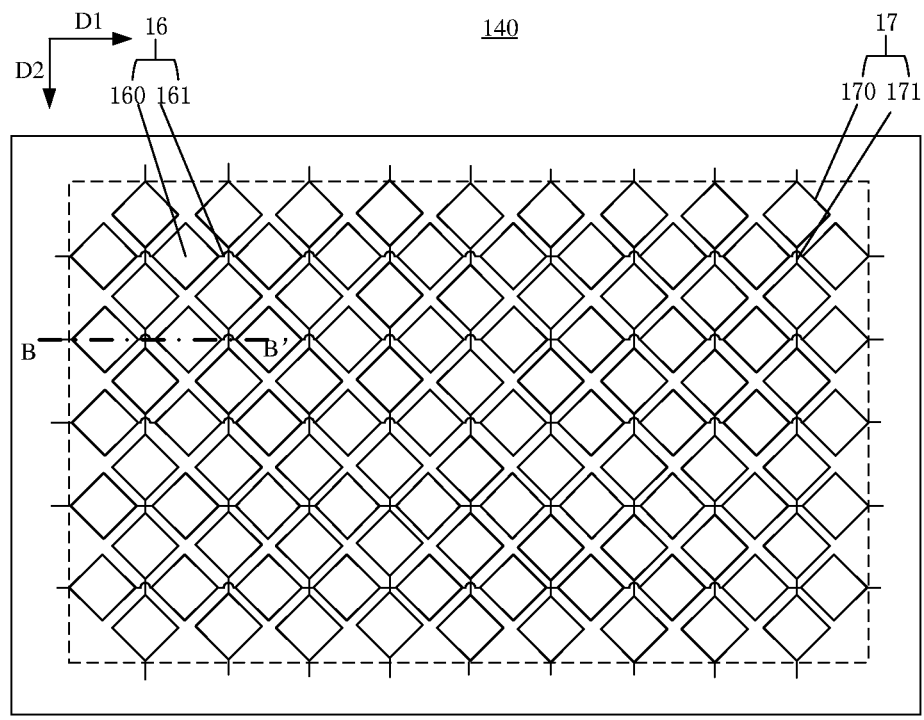
FIG. 6A is a schematic planar diagram of a flexible electronic substrate according to some other embodiments of the present disclosure.
Figure 6B:
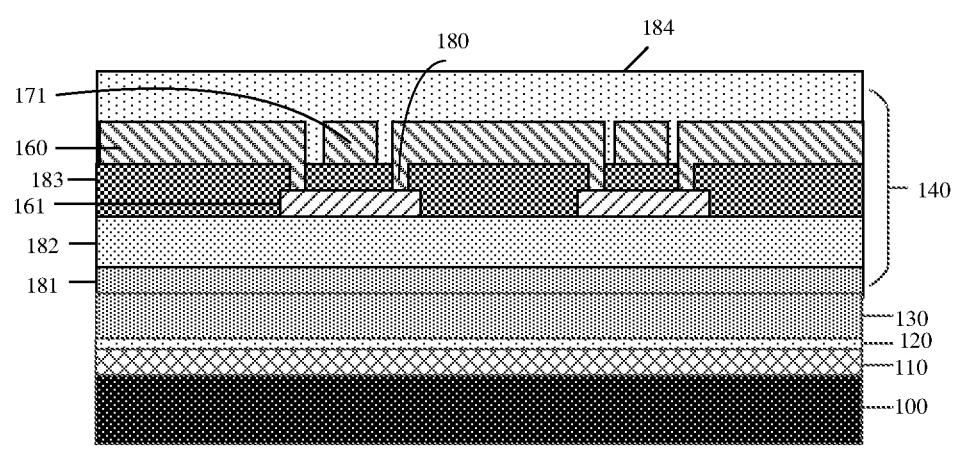
FIG. 6B is a schematic sectional diagram along sectional line B-B' in FIG. 6A.

In some other examples, the first operation circuit 140 may further include a touch circuit. FIG. 6A shows a schematic planar diagram of the flexible electronic device according to some other embodiments of the present disclosure, and FIG. 6B is a sectional view along sectional line B-B' in FIG. 6A.

The manufacturing method of the first operation circuit 140 according to some other embodiments of the present disclosure is exemplified below with reference to FIGS. 6A to 6B.

As shown in FIG. 6A, the first operation circuit 140 includes a touch circuit formed on the second substrate 130, and the touch circuit includes a plurality of first touch electrodes 16 extending in a first direction D1 and a plurality of second touch electrodes 17 extending in a second direction D2. The first and second directions D1, D2 intersect with each other, and for example, are orthogonal to each other. The first touch electrode 16 includes a first touch electrode portion 160 and a first connection line 161 which are connected alternately, and the second touch electrode 17 includes a second touch electrode portion 170 and a second connection line 171 which are connected alternately. The first and second connection lines 161, 171 overlap each other in the direction perpendicular to the surface of the first substrate 100. The first and second touch electrodes 16, 17 form mutual capacitance with each other, one of the first and second touch electrodes serves as a drive electrode, the other one serves as a sensing electrode, a drive signal is applied to the touch electrode serving as the touch drive electrode, and when a target object (such as a finger or a stylus) approaches or comes into contact with a touch panel, the touch electrode serving as the touch sensing electrode senses the change in capacitance value and outputs a corresponding electrical signal, thereby detecting an input signal, such as a touch, a gesture, or the like, and achieving a touch sensing function.

The manufacturing method of the first operation circuit 140 is exemplified below with reference to FIG. 6B.

As shown in FIG. 6B, for example, a hard coating layer (or planarization layer) 181 may be formed on the fourth surface 132 of the second substrate 130 first, and may provide a flat interface for formation of the touch circuit on the second substrate 130.

For example, the hard coating layer 181 may be formed by forming an organic material layer on the fourth surface 132 and then curing the organic material layer. For example, the hard coating layer is made of optical clear adhesive. For example, an organic material is at least one of polyimide (PI), acrylate and epoxy. For example, UV light irradiation curing is adopted as the curing method.

Then, an index margin layer 182 may be formed on the hard coating layer 181. For example, the difference of light reflectivity of a transparent electrode region and a non-transparent electrode region can be reduced by the index margin layer, thereby a transparent electrode line become unremarkable after an etching process and improving a visual effect.

For example, the index margin layer 182 has, for example, a laminated structure of niobium oxide ($Nb_2O_5$) and silicon oxide. For example, the index margin layer 182 may be formed by using a sputtering process. For example, a continuous sputtering process is performed by using a niobium target and a silicon target respectively and introducing oxygen, so as to obtain the index margin layer 182 having a composite layer structure including a niobium oxide layer and a silicon oxide layer. For example, thicknesses of the niobium oxide layer and the silicon oxide layer are adjusted by adjusting process conditions, such as sputtering power, pressure, temperature, or the like.

Next, a first conductive layer is formed on the index margin layer 182, and a patterning process is performed on the first conductive layer to form the plurality of first connection lines 161. For example, the first conductive layer is made of a metal material, such as aluminum, molybdenum, copper, silver, or the like, or an alloy material. For example, the first conductive layer is made of a silver-palladium-copper (APC) material. For example, the patterning process is a conventional photolithography process, and includes the steps of photoresist coating, exposing, developing, drying, etching, or the like.

Then, an insulation layer 183 and a via hole 180 in the insulation layer 183 are formed on the first conductive layer, and the via hole 180 is formed corresponding to the first connection line 161 and exposes a part of the first connection line 161. For example, as shown in FIG. 4B, two first via holes 180 are formed corresponding to each first connection line 161.

For example, the insulation layer 183 is made of an organic insulation material, so as to obtain a good bending resistance to adapt to functions of the flexible electronic substrate. For example, the organic insulation material is a transparent material. For example, the organic insulation material is optical clear adhesive (OCA). For example, the organic insulation material may include polyimide (PI), acrylate, epoxy, polymethylmethacrylate (PMMA), or the like.

For example, the insulation layer is made of a photosensitive material, and then, forming the insulation layer includes: forming a photosensitive material layer; performing exposure and development on the photosensitive material layer to form the via hole 180; and then drying and curing the obtained product to form the insulation layer 183.

Next, a second conductive layer is formed on the insulation layer 183, and a patterning process is performed on the second conductive layer to form the first and second touch electrode portions 160, 170 as well as the second connection line 171, so as to form the first and second touch electrodes 16, 17.

For example, as shown in FIG. 6B, the first touch electrode portion 160 is formed between two first connection lines 161 correspondingly, and electrically connected with the two first connection lines 161 through the via hole 180, thereby forming the plurality of first touch electrodes 16 extending in the first direction D1. For example, the second touch electrode 17 extends in the second direction D2 and includes the plurality of second touch electrode portions 170 and the second connection lines 171 which are connected alternately. The first and second connection lines 161, 171 overlap each other in the direction perpendicular to the first substrate 100.

For example, the second conductive layer is made of a transparent conductive material including, for example, a transparent conductive metal oxide material, such as indium tin oxide (ITO), indium zinc oxide (IZO), zinc oxide (ZnO), zinc aluminum oxide (AZO), indium gallium zinc oxide (IGZO), or the like.

For example, a protection layer 184 may be further formed on the second conductive layer to cover the above-mentioned touch electrode structure. For example, the protection layer 184 is made of transparent optical clear adhesive.

In some other examples, the first operation circuit 140 may include both the above-mentioned display circuit and the touch circuit. For example, the touch circuit is formed on the display circuit, such that the flexible electronic substrate has both the display function and the touch function.

In some other examples, for example, the first substrate 100 may also be configured as a flexible substrate, in which case the first and second substrates 100, 130 are supported by each other.

Figure 7:
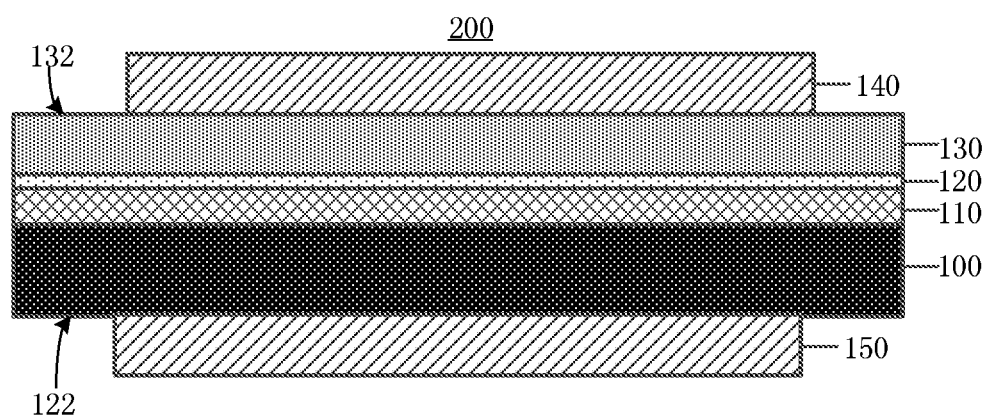
FIG. 7 is a schematic diagram of a substrate structure according to some other embodiments of the present disclosure.

FIG. 7 shows a schematic diagram of a substrate structure according to another embodiment of the present disclosure. For example, as shown in FIG. 7, the manufacturing method of the flexible electronic substrate may further include: before step S104, manufacturing a second operation circuit 150 on the second surface 121 of the first substrate 100. The second operation circuit 150 may include, for example, a display circuit and/or a touch circuit. For example, a manufacturing method of the second operation circuit 150 may refer to the manufacturing method of the first operation circuit 140, and is not repeated herein. The sequence of the first and second operation circuits 140, 150 is not limited in the embodiment of the present disclosure.

In such a manufacturing method, two flexible electronic substrates may be processed at the same time, thereby increasing a production capacity greatly, saving a production cost, and increasing a product yield and a production efficiency.

For example, after step S104, the manufacturing method may further include: cleaning the second substrate 130 to remove residues of the separation layer 110 and/or the adhesive layer 120 remaining on the third surface 131 of the second substrate 130.

The embodiments of the present disclosure further provide a substrate structure, as shown in FIG. 2, and the substrate structure 200 includes a first substrate 100, a second substrate 130 and a separation layer 110. At least one of the first and second substrates 100, 130 is configured as a flexible substrate; for example, the first substrate 100 is configured as a supporting substrate, and the second substrate 130 is configured as the flexible substrate.

The separation layer 110 is located between the first and second substrates 100, 130 which are connected by the separation layer 110. For example, the first and second substrates 100, 130 are fixed to each other by the separation layer 110. For example, as shown in FIG. 2, the substrate structure 200 may further include an adhesive layer 120 located between the separation layer 110 and the second substrate 130, and the second substrate 130 may also be adhered to a surface of the separation layer 110 by the adhesive layer 120, and thus bonded to the first substrate 100.

At least a part of the separation layer 110 is configured to be able to be cracked from a film form, so as to separate the first substrate 100 from the second substrate 130.

For example, at least a part of the separation layer 110 is configured to be able to be cracked from the film form into a powder form, thereby separating the first substrate 100 from the second substrate 130.

In some examples, the separation layer 110 includes one or more selected from the group consisting of tin and a tin alloy. For example, the alloying element(s) in the tin alloy include, in addition to tin, one or more selected from the group consisting of aluminum, copper, magnesium, manganese, zinc, bismuth, lead, antimony, silver, gold and germanium.

For example, the separation layer includes a groove structure or a hollow structure.

For example, as shown in FIG. 2, the substrate structure 200 may further include a first operation circuit 140 located at a side of the second substrate 130 away from the first substrate 100.

In some other examples, as shown in FIG. 7, the substrate structure 200 may further include a second operation circuit 150 located at a side of the first substrate 100 away from the second substrate 130.

For example, each of the first and second operation circuits 140, 150 may include a display circuit or a touch circuit.

Other descriptions of the substrate structure 200 may refer to the above description related to FIGS. 2 and 7, and are not repeated herein.

What are described above is related to the illustrative embodiments of the disclosure only and not limitative to the scope of the disclosure; the scopes of the disclosure are defined by the accompanying claims.

What is claimed is:

1. A manufacturing method of a flexible electronic substrate, comprising:
   providing a first substrate comprising a first surface and a second surface which are opposite;
   forming a separation layer on the first surface of the first substrate, wherein the separation layer is in a film form;
   providing a second substrate on the separation layer, wherein the second substrate is configured as a flexible substrate; and
   processing the separation layer, such that at least a part of the separation layer is cracked from the film form, thereby separating the second substrate from the first substrate,
   wherein the second substrate comprises a third surface and a fourth surface which are opposite, the third surface is closer to the first substrate, and
   the manufacturing method further comprises: manufacturing a first operation circuit on the fourth surface of the second substrate before processing the separation layer, and manufacturing a second operation circuit on the second surface of the first substrate before processing the separation layer.

2. The manufacturing method according to claim 1, wherein the processing action is physical processing.

3. The manufacturing method according to claim 1, wherein cracking of at least a part of the separation layer from the film form comprises:
   changing at least a part of the separation layer from the film form into a powder form.

4. The manufacturing method according to claim 1, wherein the processing action comprises a cooling processing action.

5. The manufacturing method according to claim 1, wherein the separation layer comprises one or more selected from the group consisting of tin and a tin alloy.

6. The manufacturing method according to claim 5, wherein the processing action comprises a cooling processing action, and the cooling processing action comprises cooling the separation layer below 13.2 degrees Celsius.

7. The manufacturing method according to claim 5, wherein the processing action comprises making a nucleating agent come into contact with the separation layer to crack the separation layer.

8. The manufacturing method according to claim 7, wherein the nucleating agent comprises one or more selected from the group consisting of gray tin, cadmium telluride and indium antimonide.

9. The manufacturing method according to claim 5, wherein an alloying element in the tin alloy comprises, in addition to tin, one or more selected from the group consisting of aluminum, copper, magnesium, manganese, zinc, bismuth, lead, antimony, silver, gold and germanium.

10. The manufacturing method according to claim 9, wherein the tin element in the separation layer has a mass percentage of at least 30%.

11. The manufacturing method according to claim 5, wherein cracking of the separation layer from the film form comprises:

transforming the tin from white tin to gray tin.

12. The manufacturing method according to claim 1, wherein the separation layer comprises a groove structure or a hollow structure.

13. The manufacturing method according to claim 12, wherein the groove structure or the hollow structure has an area percentage of 10% to 50%.

14. The manufacturing method according to claim 12, wherein a planar structure of the groove structure or the hollow structure has a shape of circle, rhombus, rectangle, triangle or irregular polygon.

* * * * *